United States Patent
Shin

(10) Patent No.: US 11,824,560 B2
(45) Date of Patent: Nov. 21, 2023

(54) ECC DECODERS HAVING LOW LATENCY

(71) Applicant: SK hynix Inc., Icheon-si (KR)

(72) Inventor: Won Gyu Shin, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/865,630

(22) Filed: Jul. 15, 2022

(65) Prior Publication Data

US 2022/0352905 A1    Nov. 3, 2022

Related U.S. Application Data

(62) Division of application No. 16/883,845, filed on May 26, 2020, now Pat. No. 11,424,765.

(30) Foreign Application Priority Data

Jul. 29, 2019    (KR) .......................... 10-2019-0092049

(51) Int. Cl.
*H03M 13/15*    (2006.01)

(52) U.S. Cl.
CPC ... *H03M 13/1575* (2013.01); *H03M 13/1525* (2013.01); *H03M 13/157* (2013.01); *H03M 13/1545* (2013.01)

(58) Field of Classification Search
CPC ....................... H03M 13/1575; H03M 13/1525
See application file for complete search history.

(56) References Cited

U.S. PATENT DOCUMENTS

| | | | |
|---|---|---|---|
| 3,685,014 | A | 8/1972 | Hsiao et al. |
| 5,684,810 | A | 11/1997 | Nakamura et al. |
| 5,856,988 | A | 1/1999 | Kiriyama |
| 6,735,735 | B1 | 5/2004 | Ohira et al. |
| 2003/0070133 | A1 | 4/2003 | Bauman et al. |
| 2003/0106014 | A1 * | 6/2003 | Dohmen ........... H03M 13/1595 714/785 |
| 2006/0059409 | A1 | 3/2006 | Lee |
| 2006/0236212 | A1 * | 10/2006 | Lee ................... H03M 13/1545 714/784 |
| 2009/0217140 | A1 * | 8/2009 | Jo ....................... G06F 11/1068 714/E11.032 |

(Continued)

FOREIGN PATENT DOCUMENTS

KR        101747794 B1    6/2017

*Primary Examiner* — Joseph D Torres
(74) *Attorney, Agent, or Firm* — WILLIAM PARK & ASSOCIATES LTD.

(57) ABSTRACT

An ECC decoder includes a syndrome calculation block, a fast path controller, a KES block, a CSEE block, an UED, and a multiplexer. The KES block includes a plurality of KES-stages to calculate and output an error location/magnitude polynomial of a syndrome outputted from the syndrome calculation block. Each of a second to last KES-stages of the plurality of KES-stages receives the error location/magnitude polynomial from the previous KES-stage to output an error location/magnitude polynomial generated by an additional calculating operation. The additionally calculated error location/magnitude polynomial is not transmitted to the next KES-stage but directly outputted when an error location and an error magnitude are identified by the additionally calculated error location/magnitude polynomial.

8 Claims, 13 Drawing Sheets

(56) References Cited

U.S. PATENT DOCUMENTS

| | | | |
|---|---|---|---|
| 2009/0222708 A1* | 9/2009 | Yamaga | H03M 13/19 |
| | | | 714/784 |
| 2016/0103735 A1* | 4/2016 | Lee | H03M 13/1545 |
| | | | 714/764 |
| 2017/0077963 A1* | 3/2017 | Jung | H03M 13/6502 |
| 2017/0329669 A1* | 11/2017 | Liu | G11C 29/52 |

* cited by examiner

ECC DECODERS HAVING LOW LATENCY

CROSS-REFERENCE TO RELATED APPLICATIONS

This application is a divisional of U.S. patent application Ser. No. 16/883,845, filed on May 26, 2020, which claims priority to Korean Application No. 10-2019-0092049, filed on Jul. 29, 2019. The disclosure of each of the foregoing application is incorporated herein by reference in its entirety.

BACKGROUND

1. Technical Field

Various embodiments of the disclosed technology relate to error correction technologies of memory systems and, more particularly, to error correction code (hereinafter, referred to as 'ECC') decoders having a low latency.

2. Related Art

In general, a path transmitting information is called a channel. When the information is transmitted using cable communication, a transmission line through which the information is transmitted may act as the channel. When the information is transmitted using wireless communication, the channel may be the air through which electromagnetic waves including the information are propagated. Processes for storing data into memory media (e.g., memory devices) and for reading out the data from the memory media may be performed through the channel.

When the data are transmitted through the channel, an error may be included in the data. Thus, a lot of effort has been focused on developing devices and methods for detecting errors from erroneous data and for removing the detected errors to restore the erroneous data to their original data. An ECC encoding operation and an ECC decoding operation have been widely used in memory systems including the memory media. The ECC encoding operation may correspond to a process for generating transmission data by adding an error control code (or the error correction code) to original data (i.e., write data) before the original data are transmitted to perform a write operation. The ECC decoding operation may correspond to a process for performing a read operation to read out data stored in the memory media and for separating the read data into the original data and the added code to restore the read data to the original data.

SUMMARY

According to an embodiment, an ECC decoder includes a syndrome calculation block and a path controller. The syndrome calculation block is configured to perform a syndrome calculation for generating a syndrome from a codeword and to output the syndrome. The path controller is configured to output data transmitted through a first path, a second path, and a third path. The first path is a path for transmitting the codeword to the path controller when no error is detected through the syndrome calculation. The second path includes a single-error decoding logic circuit, and the single-error decoding logic circuit corrects a single error of the codeword to transmit the corrected codeword to the path controller through the second path when the single error is detected through the syndrome calculation. The third path includes a multi-error decoding logic circuit, and the multi-error decoding logic circuit corrects at least two errors of the codeword to transmit the corrected codeword to the path controller when the at least two errors are detected through the syndrome calculation.

According to another embodiment, an ECC decoder includes a syndrome calculation block, a fast path controller, a key equation solver (KES) block, a Chien-search and errata-evaluator (CSEE) block, an uncorrectable error detector (UED), and a multiplexer. The syndrome calculation block is configured to receive a codeword from a memory medium to calculate and output a syndrome. The fast path controller is configured to receive and store the codeword and configured to output the codeword when no error is detected from a result of the calculation of the syndrome. The KES block is configured to include a plurality of KES-stages. A first KES-stage of the plurality of KES-stages is configured to calculate and output an error location/magnitude polynomial of the syndrome outputted from the syndrome calculation block. Each of a second to last KES-stages of the plurality of KES-stages is configured to receive the error location/magnitude polynomial from the previous KES-stage to output an error location/magnitude polynomial generated by an additional calculating operation. The additionally calculated error location/magnitude polynomial is not transmitted to the next KES-stage but directly outputted when an error location and an error magnitude are identified by the additionally calculated error location/magnitude polynomial. The CSEE block is configured to find a solution of the additionally calculated error location/magnitude polynomial to correct an error of the codeword. The UED is configured to perform a logical operation of output data of the CSEE block and the codeword stored in the fast path controller to discriminate whether the codeword is corrected and to output data. The multiplexer is configured to output data having an earlier input point in time out of data corresponding to the codeword outputted from the fast path controller and the data outputted from the UED as final ECC decoded data.

BRIEF DESCRIPTION OF THE DRAWINGS

Certain features of the disclosed technology are illustrated by various embodiments with reference to the attached drawings, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on," "over," "above," "under," or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
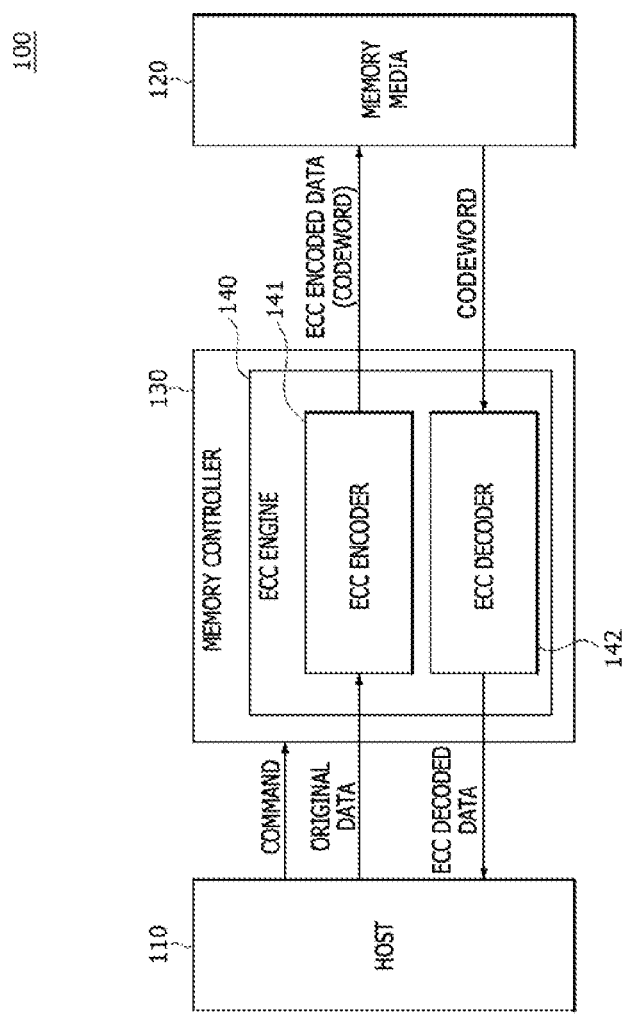
FIG. 1 is a block diagram illustrating an example of a memory system including an ECC engine.

FIG. 1 is a block diagram illustrating an example of a memory system 100 including an ECC engine 140. Referring to FIG. 1, the memory system 100 may be configured to include a host 110, a memory medium 120, and a memory controller 130. Accessing to the memory medium 120 may be achieved by a control operation of the memory controller 130 according to a request of the host 110. In an embodiment, the memory medium 120 may include a nonvolatile memory device such as a flash memory device, a phase change memory (PCRAM) device, a resistive memory (ReRAM) device, a ferroelectric memory (FeRAM) device, or a magnetic memory (MRAM) device. Alternatively, the memory medium 120 may include a volatile memory device such as a dynamic random access memory (DRAM) device. The host 110 may transmit a command to the memory controller 130. The command may include a read command or a write command. The host 110 may also transmit an address in addition to the command to the memory controller 130.

The memory controller 130 may control a read operation of data stored in the memory medium 120 in response to the read command outputted from the host 110. In addition, the memory controller 130 may control a write operation for storing data into the memory medium 120 in response to the write command outputted from the host 110. The memory controller 130 may include the ECC engine 140. The ECC engine 140 may include an ECC encoder 141 and an ECC decoder 142. The ECC engine 140 may have a function of correcting errors of data during the write operation and the read operation of the memory system 100.

Specifically, the ECC encoder 141 may perform an ECC encoding operation of original data (or write data) outputted from the host 110 during the write operation of the memory system 100. The ECC encoder 141 may output ECC encoded data including the original data and parity data. Hereinafter, the ECC encoded data may be referred to as a codeword. The codeword outputted from the ECC encoder 141 may be stored into the memory medium 120. The ECC decoder 142 may perform an ECC decoding operation of read data (i.e., the codeword) outputted from the memory medium 120 to correct errors of the read data and to output ECC decoded data. The ECC decoded data outputted from the ECC decoder 142 may be transmitted to the host 110.

Figure 2:
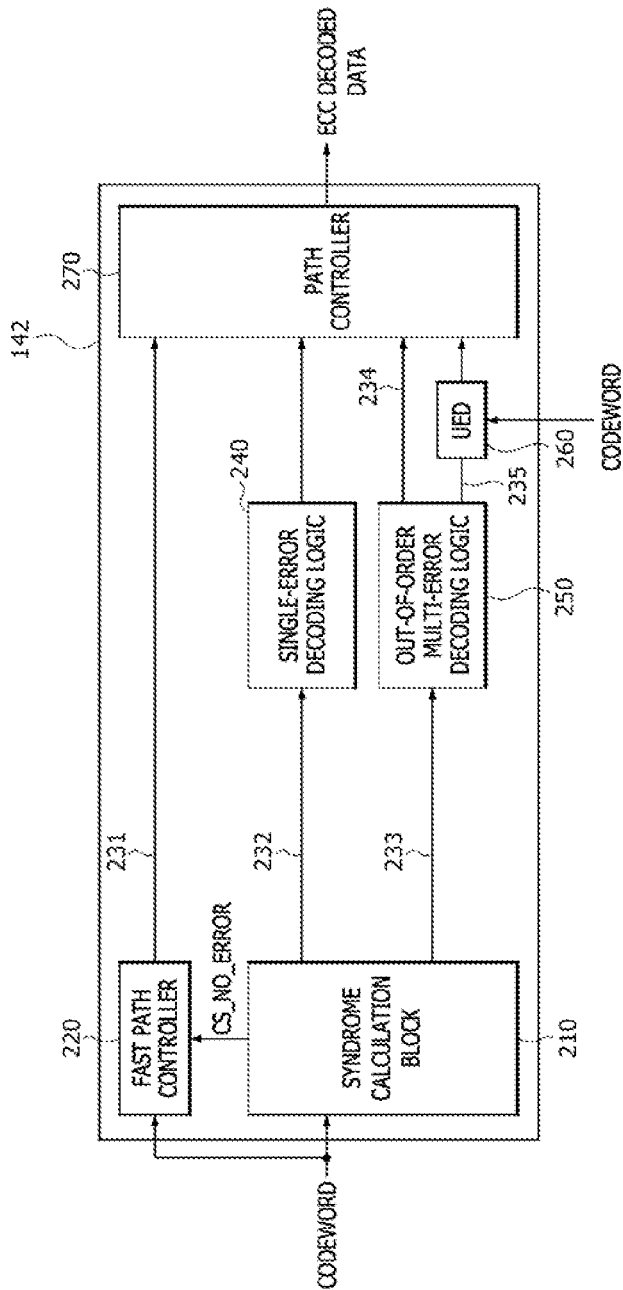
FIG. 2 is a block diagram illustrating an ECC decoder according to an embodiment of the present disclosure.

FIG. 2 is a block diagram illustrating the ECC decoder 142 included in the memory system 100 of FIG. 1. Referring to FIG. 2, the ECC decoder 142 may include a syndrome calculation block 210, a fast path controller 220, a single-error decoding logic circuit 240, an out-of-order multi-error decoding logic circuit 250, an uncorrectable error detector (UED) 260, and a path controller 270. The ECC decoder 142 may also include first to fifth paths 231, 232, 233, 234, and 235 through which data or symbols are transmitted. As described with reference to FIG. 1, the ECC decoder 142 may receive a codeword to output the ECC decoded data. The codeword inputted to the ECC decoder 142 may be simultaneously inputted to both of the syndrome calculation block 210 and the fast path controller 220.

The syndrome calculation block 210 may receive the codeword outputted from the memory medium 120 to generate and output a syndrome. In an embodiment, the syndrome calculation block 210 may be configured to include a plurality of Galois Field (GF) multipliers and a plurality of GF adders to perform a matrix operation. The number of errors included in the codeword may be determined by a value of the syndrome which is outputted from the syndrome calculation block 210 according to the matrix operation. For example, if the syndrome outputted from the syndrome calculation block 210 has a value of "0," then no error is included in the codeword. In contrast, if the syndrome outputted from the syndrome calculation block 210 has a nonzero value, then the codeword may correspond to erroneous data. If the codeword corresponds to erroneous data, then the syndrome may have the same value as a weighted value of a column in which the corresponding bit is located among columns of a calculation target matrix. Thus, the number of errors included in the codeword may be discriminated by the result of the syndrome calculation.

In an embodiment, if no error exists in the codeword as a result of the syndrome calculation, then the syndrome calculation block 210 may output a non-error control signal CS_NO_ERROR to the fast path controller 220. If one error (i.e., a single error) exists in the codeword as a result of the syndrome calculation, then the syndrome calculation block 210 may output a calculated syndrome to the single-error decoding logic circuit 240 through the second path 232. If at last two errors (i.e., a plurality of errors) exist in the codeword as a result of the syndrome calculation, then the syndrome calculation block 210 may output a calculated syndrome to the out-of-order multi-error decoding logic circuit 250 through the third path 233.

The fast path controller 220 may receive a codeword from the memory medium (120 of FIG. 1). The codeword outputted from the memory medium (120 of FIG. 1) may be stored into the fast path controller 220. In order to store the codeword into the fast path controller 220, a buffer memory may be disposed in the fast path controller 220. In an embodiment, the codeword may be simultaneously inputted to both of the syndrome calculation block 210 and the fast path controller 220. In another embodiment, a point in time when the codeword is inputted to the syndrome calculation block 210 may precede or follow a point in time when the codeword is inputted to the fast path controller 220 by at least one cycle of a clock signal. If the non-error control signal CS_NO_ERROR is transmitted from the syndrome calculation block 210 to the fast path controller 220, then the fast path controller 220 may output a codeword stored into the fast path controller 220 in response to the non-error control signal CS_NO_ERROR. The codeword outputted from the fast path controller 220 may be transmitted to the path controller 270 through the first path 231. The first path 231 may directly connect the fast path controller 220 to the path controller 270.

The single-error decoding logic circuit 240 may receive a syndrome from the syndrome calculation block 210 through the second path 232 when a single error exists in the codeword as a result of the syndrome calculation of the syndrome calculation block 210. The second path 232 may be disposed between the syndrome calculation block 210 and the path controller 270, and the single-error decoding logic circuit 240 may be coupled between the syndrome calculation block 210 and the path controller 270 through the second path 232. The single-error decoding logic circuit 240 may perform the ECC decoding operation of the syndrome outputted from the syndrome calculation block 210 through a first portion of the second path 232 to correct the error included in the codeword. The ECC decoded data outputted from the single-error decoding logic circuit 240 may be transmitted to the path controller 270 through a second portion of the second path 232. In an embodiment, the single-error decoding logic circuit 240 may include a Key-Equation Solver (KES) block calculating an error location/magnitude polynomial to output the calculated value and a Chien-Search and Errata-Evaluator (CSEE) block finding a solution of the error location/magnitude polynomial.

The out-of-order multi-error decoding logic circuit 250 may receive a syndrome from the syndrome calculation block 210 through the third path 233 when at least two errors exist in the codeword as a result of the syndrome calculation of the syndrome calculation block 210. The third path 233 may directly connect the syndrome calculation block 210 to the out-of-order multi-error decoding logic circuit 250. The out-of-order multi-error decoding logic circuit 250 may perform the ECC decoding operation of the syndrome outputted from the syndrome calculation block 210 to correct the errors included in the codeword. The out-of-order multi-error decoding logic circuit 250 may transmit the ECC decoded data to the path controller 270 through the fourth path 234 or to the UED 260 through the fifth path 235. The fourth path 234 may directly connect the out-of-order multi-error decoding logic circuit 250 to the path controller 270. The fifth path 235 may be disposed between the out-of-order multi-error decoding logic circuit 250 and the path controller 270, and the UED 260 may be coupled between the out-of-order multi-error decoding logic circuit 250 and the path controller 270 through the fifth path 235.

In an embodiment, the out-of-order multi-error decoding logic circuit 250 may detect an uncorrectable error candidate according to a result of a multi-error decoding operation. If ECC decoded data of the out-of-order multi-error decoding logic circuit 250 are not the uncorrectable error candidate, then the ECC decoded data of the out-of-order multi-error decoding logic circuit 250 may be transmitted to the path controller 270 through the fourth path 234. In contrast, if the ECC decoded data of the out-of-order multi-error decoding logic circuit 250 correspond to the uncorrectable error candidate, then the ECC decoded data of the out-of-order multi-error decoding logic circuit 250 may be transmitted to the UED 260 through the fifth path 235.

The UED 260 may perform an exclusive OR operation of the ECC decoded data outputted from the out-of-order multi-error decoding logic circuit 250 and the codeword inputted to the UED 260 to discriminate whether the errors of the codeword are corrected or the errors of the codeword are uncorrectable errors. In order that UED 260 performs an exclusive OR operation of the ECC decoded data outputted from the out-of-order multi-error decoding logic circuit 250 and the codeword inputted to the UED 260, the UED 260 may be configured to include an exclusive OR arithmetic element. In an embodiment, if all bits are generated to have a logic "low(0)" level as a result of the exclusive OR operation performed in the UED 260, then it means that the errors of the codeword are corrected. In contrast, if all bits are generated to have a logic "high(1)" level as a result of the exclusive OR operation performed in the UED 260, then the errors of the codeword may be regarded as uncorrectable errors. The ECC decoded data outputted from the UED 260 may be transmitted to the path controller 270 through the fifth path 235. If the errors of the codeword are discriminated as uncorrectable errors, then the ECC decoded data outputted from the UED 260 may include a flag indicating uncorrectable errors.

The path controller 270 may output the ECC decoded data inputted through the first, second, fourth, or fifth path 231, 232, 234, or 235. Although the codewords stored in the fast path controller 220 are transmitted through the first path 231, each of the codewords transmitted to the path controller 270 through the first path 231 may be referred to as the ECC decoded data in the present embodiment. The path controller 270 may output the ECC decoded data in the same sequence as the ECC decoded data are transmitted through the first, second, fourth, or fifth path 231, 232, 234, or 235.

The ECC decoder 142 may output the ECC decoded data in a non-sequential manner or out of order. The non-sequential output of the ECC decoded data of the ECC decoder 142 means that the ECC decoder 142 does not output the ECC decoded data in a sequence that the codewords are inputted from the memory medium to the ECC decoder 142 but output the ECC decoded data in a sequence that the ECC decoded data are inputted to the path controller 270. Specifically, it may be assumed, for an embodiment, that a first codeword and a second codeword are sequentially outputted from the memory medium. In such a case, after a first syndrome of the first codeword is calculated, a second syndrome of the second codeword may be calculated. Thus, in the case of a general ECC decoder, after first ECC decoded data corresponding to a result of a first ECC decoding operation performed using the first syndrome are outputted from the general ECC decoder, second ECC decoded data corresponding to a result of a second ECC decoding operation performed using the second syndrome may be outputted from the ECC decoder. However, in the case of the ECC decoder 142, if the second ECC decoding operation terminates before the first ECC decoding operation terminates, then the second ECC decoded data may be inputted to the path controller 270 before the first ECC decoded data are inputted to the path controller 270. Subsequently, the ECC decoder 142 may output the second ECC decoded data earlier than the first ECC decoded data due to the non-sequential operation of the path controller 270.

Figure 3:
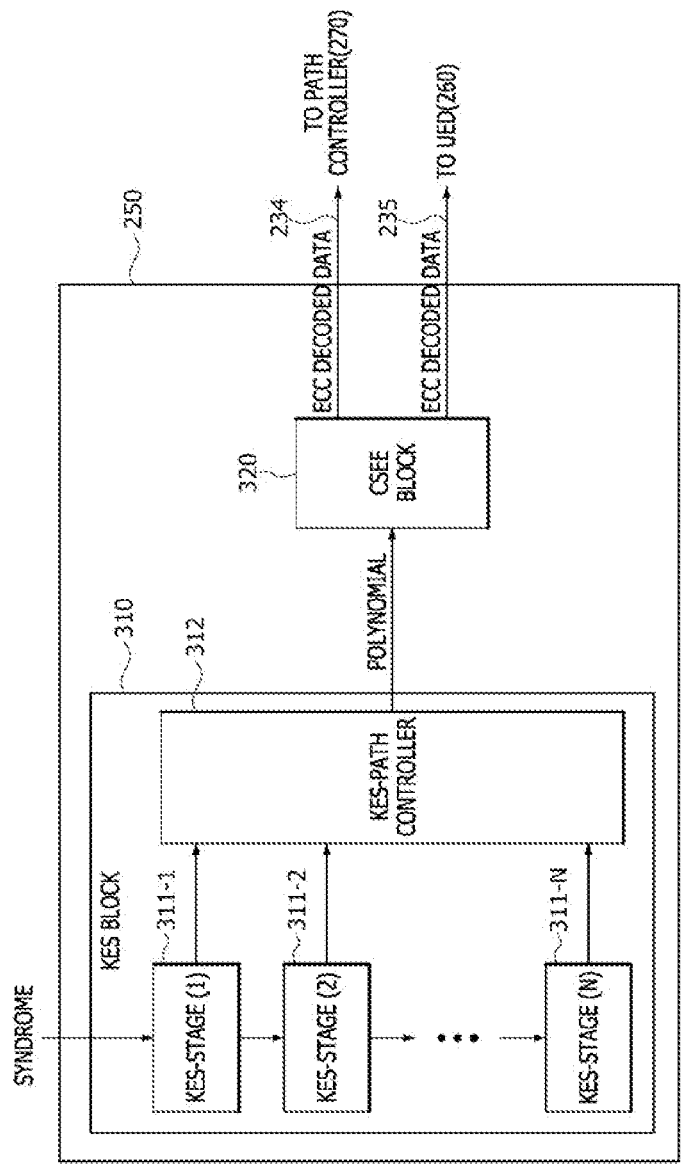
FIG. 3 is a block diagram illustrating an example of an out-of-order multi-error decoding logic circuit included in the ECC decoder of FIG. 2.

FIG. 3 is a block diagram illustrating an example of the out-of-order multi-error decoding logic circuit 250 included in the ECC decoder 142 of FIG. 2. Referring to FIG. 3, the out-of-order multi-error decoding logic circuit 250 may be configured to include a KES block 310 and a CSEE block 320. The KES block 310 may receive syndromes from the syndrome calculation block (210 of FIG. 2) to calculate and output a polynomial indicating an error location and an error magnitude. The CSEE block 320 may receive the polynomial from the KES block 310 and may perform a matrix operation to find a solution of the polynomial. In such a case, a row size of the matrix may be equal to a size of the polynomial, and a column size of the matrix may be equal to a size of the codeword. The CSEE block 320 may output final ECC decoded data as a result of the matrix operation. If a solution of the polynomial is found, then the ECC decoded data outputted from the CSEE block 320 may correspond to a corrected codeword. In contrast, if the solution of the polynomial is not found, then the ECC decoded data outputted from the CSEE block 320 may correspond to an errata-code.

The KES block 310 may include a plurality of KES-stages (e.g., first to $N^{th}$ KES-stages 311-1, 311-2, . . . , and 311-N) and a KES-path controller 312. The first to $N^{th}$ KES-stages 311-1, 311-2, . . . , and 311-N may be coupled to be cascaded such that output data of a previous KES-stage are inputted to a next KES-stage directly connected to the previous KES-stage. The first KES-stage 311-1 among the first to $N^{th}$ KES-stages 311-1, 311-2, . . . , and 311-N may calculate a first error location/magnitude polynomial using a syndrome inputted to the first KES-stage 311-1. If an error location and an error magnitude are not identified by an operation of the first KES-stage 311-1, then the first error location/magnitude polynomial may be inputted to the second KES-stage 311-2. The second KES-stage 311-2 may also calculate a second error location/magnitude polynomial using the first error location/magnitude polynomial, and the second error location/magnitude polynomial may be inputted to the third KES-stage 311-3 if an error location and an error magnitude are not identified by an operation of the second KES-stage 311-2. The calculation of the error location/magnitude polynomial described above may be sequentially performed from the first KES-stage 311-1 to the $N^{th}$ KES-stage 311-N.

If an error location and an error magnitude are identified by an operation of a certain KES-stage among the first to $N^{th}$ KES-stages 311-1, 311-2, . . . , and 311-N, then the error location/magnitude polynomial outputted from the certain KES-stage is not transmitted to a next KES-stage of the certain KES-stage but directly transmitted to the KES-path controller 312. For example, if an error location and an error magnitude are identified in the first error location/magnitude polynomial calculated by an operation of the first KES-stage 311-1, then the first error location/magnitude polynomial is not inputted to the second KES-stage 311-2 but inputted to the KES-path controller 312. However, in case of the last KES-stage (i.e., the $N^{th}$ KES-stage 311-N), the $N^{th}$ error location/magnitude polynomial may be transmitted to the KES-path controller 312 regardless of whether the error location and an error magnitude are identified in the $N^{th}$ error location/magnitude polynomial. As such, an error location/ magnitude polynomial may be directly transmitted from one of the first to $N^{th}$ KES-stages 311-1, 311-2, . . . , and 311-N to the KES-path controller 312 according to identification of an error location and an error magnitude during calculation of the error location/magnitude polynomial.

The KES-path controller 312 may receive the error location/magnitude polynomial from each of the first to $N^{th}$ KES-stages 311-1, 311-2, . . . , and 311-N to output the error location/magnitude polynomials out of order. The non-sequential output of the error location/magnitude polynomials of the KES-path controller 312 means that the KES-path controller 312 outputs the error location/magnitude polynomials in a sequence that the error location/magnitude polynomials are inputted to the KES-path controller 312. Thus, the error location/magnitude polynomial of the codeword (or the syndrome) inputted to the KES block 310 later may be outputted from the KES-path controller 312 earlier than the error location/magnitude polynomial of the codeword (or the syndrome) inputted to the KES block 310 earlier according to a result of the operations of the first to $N^{th}$ KES-stages 311-1, 311-2, . . . , and 311-N. As described with reference to FIG. 2, it may be assumed, for an embodiment, that the first codeword and the second codeword are sequentially outputted from the host. In such a case, after the first syndrome of the first codeword is calculated, the second syndrome of the second codeword may be calculated. Accordingly, after the first syndrome is inputted to the KES block 310, the second syndrome may be inputted to the KES block 310. Now, it may be assumed, for an embodiment, that the $N^{th}$ error location/magnitude polynomial outputted from the $N^{th}$ KES-stage 311-N and the first error location/magnitude polynomial outputted from the first KES-stage 311-1 are inputted to the KES-path controller 312 according to a result of an operation of the KES block 310 regarding the first and second syndromes. In such a case, the first error location/magnitude polynomial may be inputted to the KES-path controller 312 before the second error location/magnitude polynomial is inputted to the KES-path controller 312. Thus, the KES-path controller 312 may output the first error location/magnitude polynomial regarding the second codeword earlier than the $N^{th}$ error location/magnitude polynomial regarding the first codeword according to the non-sequential operation.

The CSEE block 320 may find a solution of the error location/magnitude polynomial outputted from the KES-path controller 312 to obtain an error location and an error magnitude. In an embodiment, the CSEE block 320 may be configured to include a Chien matrix, a Forney matrix, and a Galois multiplier/Galois inverter. The Chien matrix may perform a Chien matrix operation regarding the error location/magnitude polynomial to obtain an error location. The Forney matrix may perform a Forney matrix operation regarding the error location/magnitude polynomial to obtain an error magnitude. The Galois multiplier/Galois inverter may perform a Galois multiplying operation and a Galois inverting operation regarding the results of the Chien matrix operation and the Forney matrix operation to generate final ECC decoded data. The final ECC decoded data may be a corrected codeword or an incorrected codeword according to whether errors are corrected.

The ECC decoded data outputted from the CSEE block 320 may be transmitted to the path controller 270 through the fourth path 234 or the UED 260 through the fifth path 235 according to whether the uncorrectable error candidate is detected. In an embodiment, each of the first to $N^{th}$ KES-stages 311-1, 311-2, . . . , and 311-N may discriminate whether the error location/magnitude polynomial corresponds to the uncorrectable error candidate according to a result of the calculation of the error location/magnitude polynomial. If the error location/magnitude polynomial outputted from the KES-stage through the KES-path controller 312 corresponds to the uncorrectable error candidate, then the ECC decoded data outputted from the CSEE block 320 may be transmitted to the UED 260. In contrast, if the error location/magnitude polynomial outputted from the KES-stage through the KES-path controller 312 does not correspond to the uncorrectable error candidate, then the ECC decoded data outputted from the CSEE block 320 may be transmitted to the path controller 270.

Figure 4:
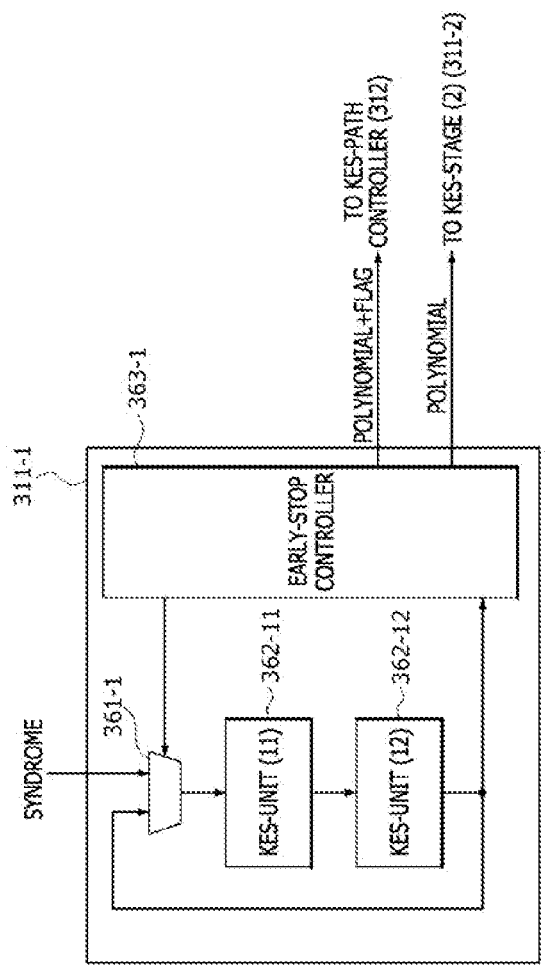
FIG. 4 is a block diagram illustrating an example of one of the key equation solver (KES) stages included in the out-of-order multi-error decoding logic circuit of FIG. 3.

FIG. 4 is a block diagram illustrating a configuration of the first KES-stage 311-1 included in the out-of-order multi-error decoding logic circuit 250 of FIG. 3. The first KES-stage 311-1 may have the same configuration as each of the second to $N^{th}$ KES-stages 311-2, . . . , and 311-N except that the first KES-stage 311-1 receives the syndrome. Each of the second to $N^{th}$ KES-stages 311-2, . . . , and 311-N may receive the error location/magnitude polynomial outputted from the previous KES-stage. Referring to FIG. 4, the first KES-stage 311-1 may be configured to include a multiplexer 361-1, first and second KES-units 362-11 and 362-12, and an early-stop controller 363-1. The multiplexer 361-1 may receive the syndrome through a first input terminal and output data of the second KES-unit 362-12 through a second input terminal. The multiplexer 361-1 may also receive a control signal from the early-stop controller 363-1 and may output the syndrome or the output data of the second KES-unit 362-12 according to the control signal.

Each of the first and second KES-units 362-11 and 362-12 may perform a calculating operation using a Berlkamp-Messey algorithm (BMA) to output the error location/magnitude polynomial. The calculating operation for generating the error location/magnitude polynomial may be sequentially performed by a plurality of KES-units (i.e., the first and second KES-units 362-11 and 362-12). The number of the KES-units included in the first KES-stage 311-1 may be set to be different according to the embodiments. If the number of the KES-units included in the first KES-stage 311-1 increases, then the accuracy of calculating the error location/magnitude polynomial may become improved but the calculating time of the error location/magnitude polynomial may become increased. The first KES-unit 362-11 may perform a calculating operation of the error location/magnitude polynomial using the syndrome outputted from the multiplexer 361-1 and may output the result of the calculating operation to the next KES-unit (i.e., the second KES-unit 362-12). The error location/magnitude polynomial outputted from the second KES-unit 362-12 corresponding to a last KES-unit may be inputted to the second input terminal of the multiplexer 361-1 for an iterative calculating operation of the error location/magnitude polynomial. In addition, the error location/magnitude polynomial outputted from the second KES-unit 362-12 corresponding to the last KES-unit may also be inputted to the early-stop controller 363-1.

The early-stop controller 363-1 may transmit the error location/magnitude polynomial outputted from the second KES-unit 362-12 to the KES-path controller 312 or a next KES-stage (i.e., the second KES-stage 311-2). In an embodiment, the early-stop controller 363-1 may output the control signal to a control terminal of the multiplexer 361-1 to select an output signal of the multiplexer 361-1. In an embodiment, the early-stop controller 363-1 may discriminate whether an error location and an error magnitude are identified by the error location/magnitude polynomial inputted to the early-stop controller 363-1. If the error location and the error magnitude are identified by the error location/magnitude polynomial transmitted from the second KES-unit 362-12 to the early-stop controller 363-1, then the early-stop controller 363-1 may output the error location/magnitude polynomial to the KES-path controller 312. In contrast, if the error location and the error magnitude are not identified by the error location/magnitude polynomial transmitted from the second KES-unit 362-12 to the early-stop controller 363-1, then the early-stop controller 363-1 may output the error location/magnitude polynomial to the second KES-stage 311-2 for calculation of an additional error location/magnitude polynomial.

In an embodiment, the early-stop controller 363-1 may discriminate whether the error location/magnitude polynomial inputted to the early-stop controller 363-1 corresponds to the uncorrectable error candidate. The discrimination about whether the error location/magnitude polynomial corresponds to the uncorrectable error candidate may be performed in consideration of the number of errors included in the error location/magnitude polynomial. The early-stop controller 363-1 may output a flag about whether the error location/magnitude polynomial corresponds to the uncorrectable error candidate to the KES-path controller 312. In an embodiment, if the error location/magnitude polynomial is regarded as the uncorrectable error candidate, then the early-stop controller 363-1 may output the flag having a logic "high(1)" level with the error location/magnitude polynomial to the KES-path controller 312. In contrast, if the error location/magnitude polynomial is not regarded as the uncorrectable error candidate, then the early-stop controller 363-1 may output the flag having a logic "low(0)" level with the error location/magnitude polynomial to the KES-path controller 312.

Figure 5:
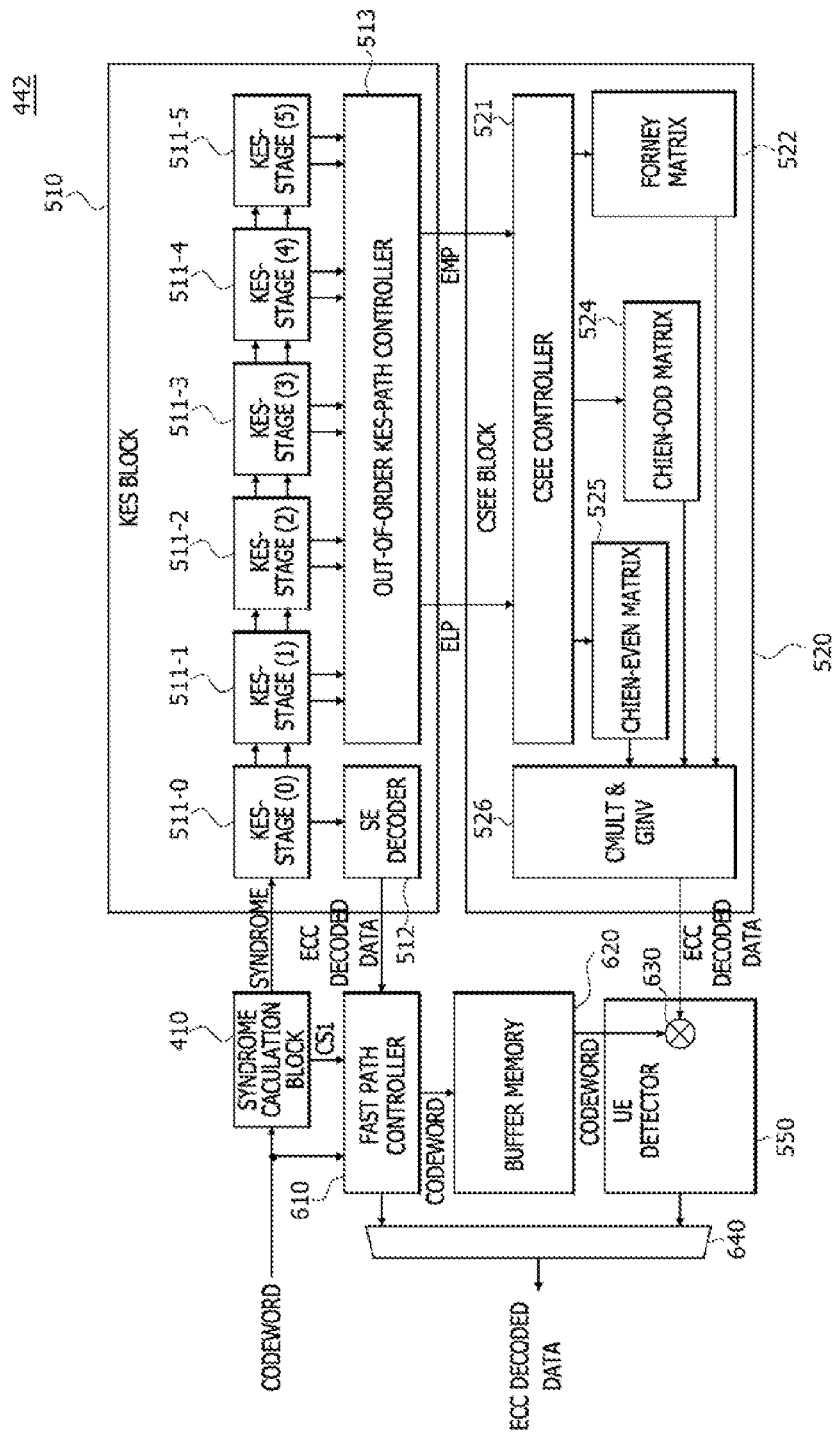
FIG. 5 is a block diagram illustrating an ECC decoder according to another embodiment of the present disclosure.

FIG. 5 is a block diagram illustrating an ECC decoder 442 corresponding to another example of the ECC decoder 142 shown in FIGS. 1 and 2. Referring to FIG. 5, the ECC decoder 442 may be configured to include a syndrome calculation block 410, a KES block 510, a CSEE block 520, a UED 550, a fast path controller 610, a buffer memory 620, and a multiplexer 640. The ECC decoder 442 may have a fast decoding path and a normal decoding path. The fast decoding path may be defined as a path through which data relating to the ECC decoding operation are transmitted when the number of errors is at most one. The normal decoding path may be defined as a path through which data relating to the ECC decoding operation are transmitted when the number of errors is at least two.

The syndrome calculation block 410 may receive a codeword from a memory medium to generate and output a syndrome. The syndrome outputted from the syndrome calculation block 410 may be transmitted to the KES block 510. In an embodiment, the syndrome calculation block 410 may output a first control signal CS1 to the fast path controller 610. The first control signal CS1 may be a signal indicating presence or absence of an error after the syndrome is calculated. For example, if no error exists after the syndrome is calculated, then the syndrome calculation block 410 may output the first control signal CS1 having a logic "low(0)" level to the fast path controller 610. In contrast, if an error exists after the syndrome is calculated, then the syndrome calculation block 410 may output the first control signal CS1 having a logic "high(1)" level to the fast path controller 610.

The fast path controller 610 may receive the codeword outputted from the memory medium and the first control signal CS1 outputted from the syndrome calculation block 410. In addition, the fast path controller 610 may also receive ECC decoded data from the KES block 510. The codeword inputted to the fast path controller 610 may be temporarily stored into a storage region included in the fast path controller 610. The fast path controller 610 may perform a data input/output (I/O) operation which is appropriate according to a logic level of the first control signal CS1. For example, if the first control signal CS1 has a logic "low(0)" level (indicating the absence of the error), then the fast path controller 610 may output the codeword stored into the fast path controller 610 to an input terminal of the multiplexer 640. However, if the first control signal CS1 has a logic "high(1)" level (indicating the presence of the error) and ECC decoded data are transmitted from the KES block 510 to the fast path controller 610, then the fast path controller 610 may output the ECC decoded data outputted from the KES block 510 to an input terminal of the multiplexer 640. In contrast, if the first control signal CS1 has a logic "high(1)" level (indicating the presence of the error) but no ECC decoded data are transmitted from the KES block 510 to the fast path controller 610, then the fast path controller 610 may transmit the codeword stored into the fast path controller 610 to the buffer memory 620.

The KES block 510 may be configured to include a plurality of KES-stages (e.g., first to sixth KES-stages 511-0, . . . , and 511-5), a single error decoder 512 and an out-of-order KES-path controller 513. Each of the first to sixth KES-stages 511-0, . . . , and 511-5 may perform a calculating operation of an error location/magnitude polynomial. The first to sixth KES-stages 511-0, . . . , and 511-5 may be coupled to be cascaded such that output data of a previous KES-stage are inputted to a next KES-stage directly connected to the previous KES-stage. The output data of the first KES-stage 511-0 receiving the syndrome from the syndrome calculation block 410 may be inputted to the single error decoder 512 or the second KES-stage 511-1. The output data of each of the second to fifth KES-stages 511-1, . . . , and 511-4 may be inputted to the next KES-stage or the out-of-order KES-path controller 513. The output data of the sixth KES-stage 511-5 corresponding to the last KES-stage may be inputted to the out-of-order KES-path controller 513.

Each of the first to sixth KES-stages 511-0, . . . , and 511-5 may have substantially the same configuration as the first KES-stage 311-1 described with reference to FIG. 4. The first KES-stage 511-0 may receive the syndrome from the syndrome calculation block 410 to calculate and output a first error location/magnitude polynomial. After the first error location/magnitude polynomial is generated, the first KES-stage 511-0 may discriminate whether the number of errors is one or at least two. If the number of errors is one (i.e., the codeword includes a single error), then the first KES-stage 511-0 may output the calculated error location/magnitude polynomial to the single error decoder 512. In contrast, if the number of errors is at least two (i.e., the codeword includes at least two errors), then the first KES-stage 511-0 may output the calculated error location/magnitude polynomial to the second KES-stage 511-1. In an embodiment, the first error location/magnitude polynomial transmitted from the first KES-stage 511-0 to the second KES-stage 511-1 may be separated into a first error-locator polynomial (ELP) and a first error-magnitude polynomial (EMP). The ELP may be a polynomial identifying an error location, and the EMP may be a polynomial identifying an error magnitude.

The second KES-stage 511-1 may perform a calculating operation of the first ELP and the first EMP outputted from the first KES-stage 511-0 using the BMA to generate and output a second ELP and a second EMP. In the same way, each of the third to sixth KES-stages 511-2, . . . , and 511-5 may perform a calculating operation of the ELP and the EMP outputted from the previous KES-stage using the BMA to generate and output its ELP and its EMP corresponding to a result of the calculating operation. As described with reference to FIG. 4, if the error location and the error magnitude are identified by an early-stop controller (corresponding to the early-stop controller 363-1 of FIG. 4) included in a certain KES-stage among the second to sixth KES-stages 511-1, . . . , and 511-5, then the certain KES-stage may transmit the ELP and EMP not to the next KES-stage but to the out-of-order KES-path controller 513.

The out-of-order KES-path controller 513 may receive the ELP and the EMP from each of the second to sixth KES-stages 511-1, . . . , and 511-5 to non-sequentially output the ELP and the EMP. The ELP and the EMP outputted from the out-of-order KES-path controller 513 may be inputted to the CSEE block 520. The sequence of data outputted from the out-of-order KES-path controller 513 may be out of order. That is, the out-of-order KES-path controller 513 may output the data not in a sequence that the data are outputted from the memory medium but in a sequence that the data are inputted to the out-of-order KES-path controller 513 in the KES block 510. Thus, the ELP and the EMP of the codeword (or the syndrome) inputted to the ECC decoder 442 later may be outputted from the out-of-order KES-path controller 513 earlier than the ELP and the EMP of the codeword (or the syndrome) inputted to the ECC decoder 442 earlier according to a result of the operation of each of the second to sixth KES-stages 511-1, . . . , and 511-5.

The CSEE block 520 may find solutions of the ELP and the EMP outputted from the out-of-order KES-path controller 513 to obtain the error location and the error magnitude. The CSEE block 520 may output the ECC decoded data, and the ECC decoded data may be inputted to the UED 550. In an embodiment, the CSEE block 520 may be configured to include a CSEE controller 521, a Forney matrix 522, a Chien-odd matrix 524, a Chien-even matrix 525, and a Galois multiplier/Galois inverter 526. The CSEE controller 521 may receive the ELP and the EMP from the out-of-order KES-path controller 513 and may output the ELP and the EMP to each of the Forney matrix 522, the Chien-odd matrix 524, and the Chien-even matrix 525.

The Forney matrix 522 may find the error magnitude through a relationship between the ELP and the EMP using a Forney's algorithm. The Chien-odd matrix 524 and the Chien-even matrix 525 may perform a calculating operation for finding a solution of the ELP. In the present embodiment, the calculating operation of the Forney matrix 522 and the calculating operation of the Chien-odd matrix 524 and the Chien-even matrix 525 may be performed in parallel. The Galois multiplier/Galois inverter 526 may perform a Galois multiplying operation and a Galois inverting operation regarding the results of the operations of the Forney matrix 522, the Chien-odd matrix 524, and the Chien-even matrix 525 to generate final ECC decoded data.

The UED 550 may receive the codeword from the buffer memory 620 and may also receive the ECC decoded data from the CSEE block 520. In an embodiment, the UED 550 may include an exclusive OR arithmetic element 630. The exclusive OR arithmetic element 630 may perform an exclusive OR operation of the codeword outputted from the buffer memory 620 and the ECC decoded data outputted from the CSEE block 520 bit-by-bit, thereby outputting final ECC decoded result data. In an embodiment, if all bits are generated to have a logic "low(0)" level as a result of the exclusive OR operation performed in the UED 550, then it means that the errors of the codeword are corrected. In contrast, if all bits are generated to have a logic "high(1)" level as a result of the exclusive OR operation performed in the UED 550, then the errors of the codeword may be regarded as uncorrectable errors. If the errors of the codeword are discriminated as uncorrectable errors, then the ECC decoded data outputted from the UED 550 may include a flag indicating uncorrectable errors. The ECC decoded data outputted from the UED 550 may be inputted to an input terminal of the multiplexer 640.

The multiplexer 640 may have a first input terminal, a second input terminal, and an output terminal. The ECC decoded data transmitted through the fast decoding path may be inputted to the first input terminal of the multiplexer 640. Thus, the ECC decoded data outputted from the fast path controller 610 may be inputted to the first input terminal of the multiplexer 640. The ECC decoded data transmitted through the normal decoding path may be inputted to the second input terminal of the multiplexer 640. Thus, the ECC decoded data outputted from the UED 550 may be inputted to the second input terminal of the multiplexer 640. The multiplexer 640 may output the ECC decoded data inputted through one of the first input terminal and the second input terminal. If the ECC decoded data outputted from the fast path controller 610 and the ECC decoded data outputted from the UED 550 are simultaneously inputted to the multiplexer 640 through the first and second input terminals, then the multiplexer 640 may output the ECC decoded data inputted through the second input terminal of the multiplexer 640 earlier than the ECC decoded data inputted through the first input terminal of the multiplexer 640.

Figure 6:
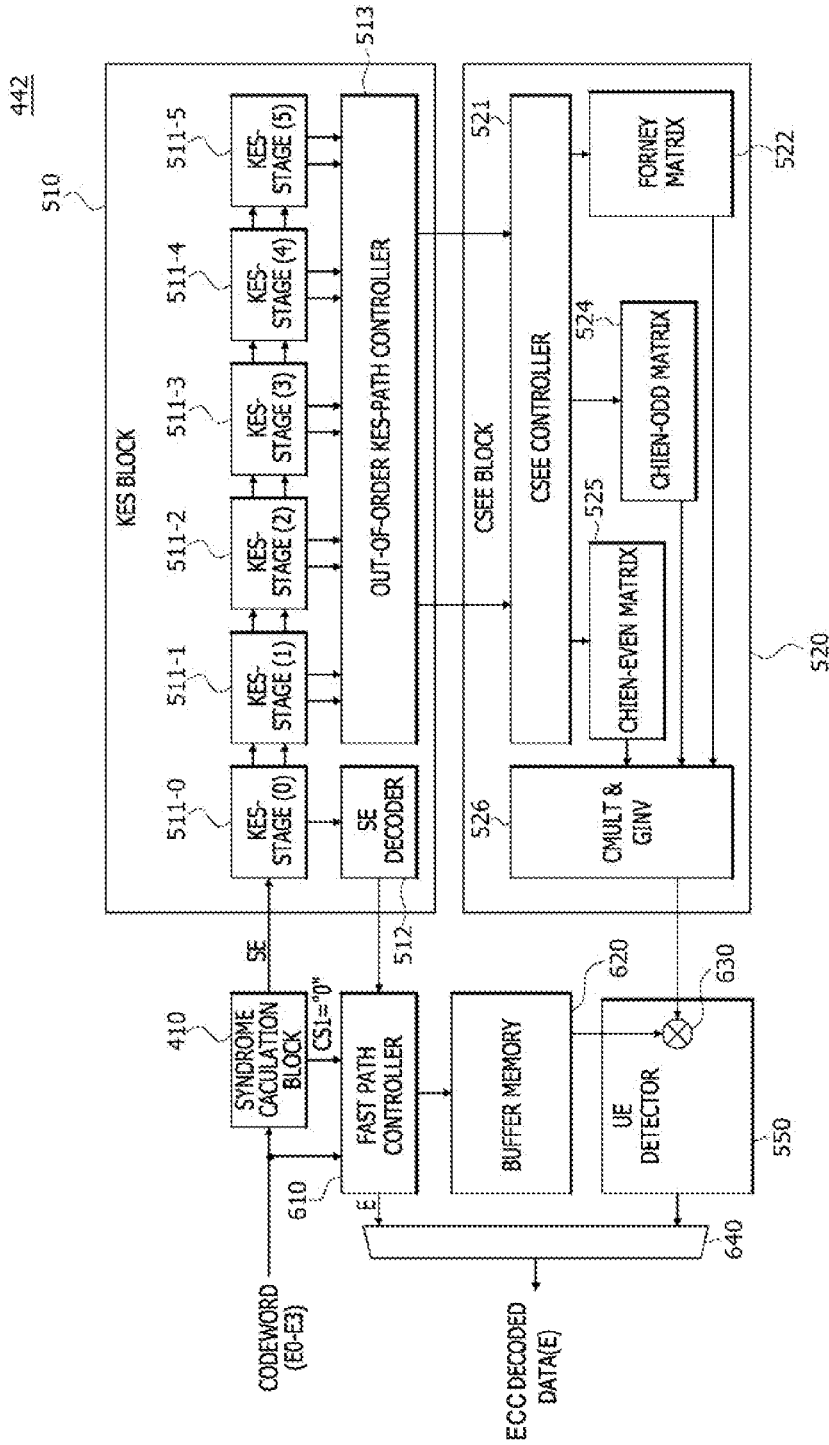
FIG. 6 is a block diagram illustrating a procedure of processing non-erroneous data in the ECC decoder shown in FIG. 5.
Figure 7:
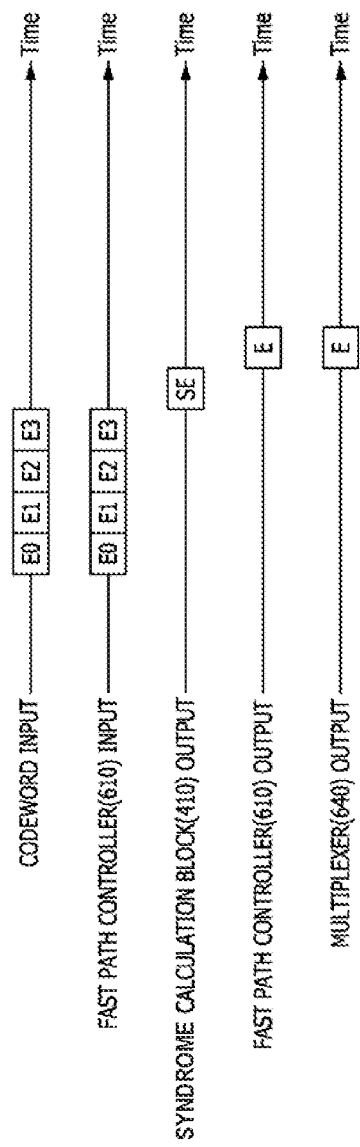
FIG. 7 is a timing diagram illustrating a procedure of processing non-erroneous data in the ECC decoder shown in FIG. 5.

FIGS. 6 and 7 are a block diagram and a timing diagram illustrating a procedure of processing non-erroneous data in the ECC decoder 442 shown in FIG. 5, respectively. In FIG. 6, the same reference numerals as used in FIG. 5 denote the same elements. Referring to FIGS. 6 and 7, it may be assumed, for an embodiment, that a codeword E outputted from the memory medium has a data size of 176 bytes. In an embodiment, if a burst length is set to be four, then the codeword E may include a first codeword E0, a second codeword E1, a third codeword E2, and a fourth codeword E3, each of which has a data size of 44 bytes. In such a case, the first codeword E0, the second codeword E1, the third codeword E2, and the fourth codeword E3 may be sequentially inputted to each of the syndrome calculation block 410 and the fast path controller 610. The syndrome calculation block 410 may calculate and output a syndrome SE of the codeword E. If no error detects during the calculation of the syndrome SE, then the syndrome calculation block 410 may output the first control signal CS1 having a logic "low(0)" level to the fast path controller 610. If the first control signal CS1 having a logic "low(0)" level is inputted to the fast path controller 610, then the fast path controller 610 may transmit the codeword E to the first input terminal of the multiplexer 640. In such a case, the multiplexer 640 may output the codeword E as the final ECC decoded data.

Figure 8:
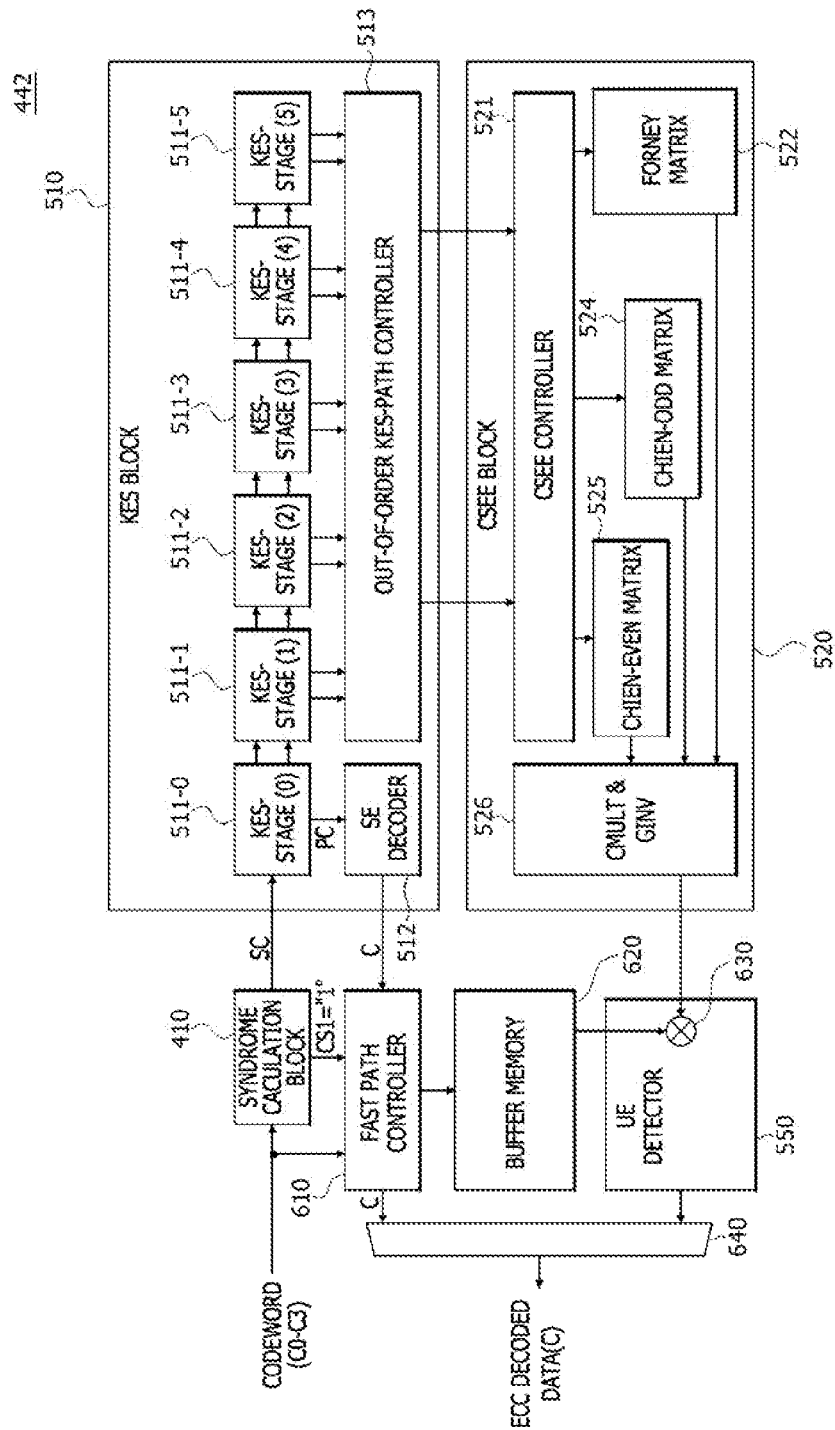
FIG. 8 is a block diagram illustrating a procedure of processing single-error data in the ECC decoder shown in FIG. 5.
Figure 9:
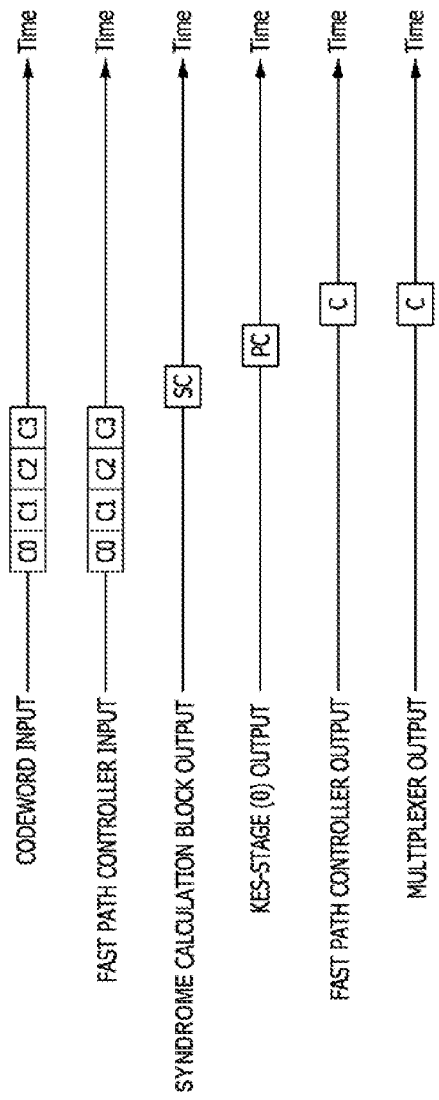
FIG. 9 is a timing diagram illustrating a procedure of processing single-error data in the ECC decoder shown in FIG. 5.

FIGS. 8 and 9 are a block diagram and a timing diagram illustrating a procedure of processing single-error data in the ECC decoder 442 shown in FIG. 5, respectively. In FIG. 8, the same reference numerals as used in FIG. 5 denote the same elements. Referring to FIGS. 8 and 9, it may be assumed, for an embodiment, that a codeword C outputted from the memory medium has a data size of 176 bytes. If a burst length is set to be four, then the codeword C may include a first codeword C0, a second codeword C1, a third codeword C2, and a fourth codeword C3, each of which has a data size of 44 bytes. In such a case, the first codeword C0, the second codeword C1, the third codeword C2, and the fourth codeword C3 may be sequentially inputted to each of the syndrome calculation block 410 and the fast path controller 610. The syndrome calculation block 410 may calculate and output a syndrome SC of the codeword C. If an error exists during the calculation of the syndrome SC, then the syndrome calculation block 410 may output the first control signal CS1 having a logic "high(1)" level to the fast path controller 610. If the first control signal CS1 having a logic "high(1)" level is inputted to the fast path controller 610, then the fast path controller 610 may wait for ECC decoded data outputted from the KES block 510.

The syndrome SC outputted from the syndrome calculation block 410 may be inputted to the first KES-stage 511-0 of the KES block 510. The first KES-stage 511-0 may perform a matrix operation of the syndrome SC to calculate an error location/magnitude polynomial PC. If a single error is detected during the calculation of the error location/magnitude polynomial PC, then the first KES-stage 511-0 may output the error location/magnitude polynomial PC to the single error decoder 512. The single error decoder 512 may find a solution of the error location/magnitude polynomial PC to correct the single error. The ECC decoded data C, which are corrected, may be inputted to the fast path controller 610. As the first control signal CS1 having a logic "high(1)" level and the corrected ECC decoded data C are inputted to the fast path controller 610, the fast path controller 610 may output the corrected ECC decoded data C to the first input terminal of the multiplexer 640. In such a case, the multiplexer 640 may output the codeword C corresponding to the corrected ECC decoded data as the final ECC decoded data.

Figure 10:
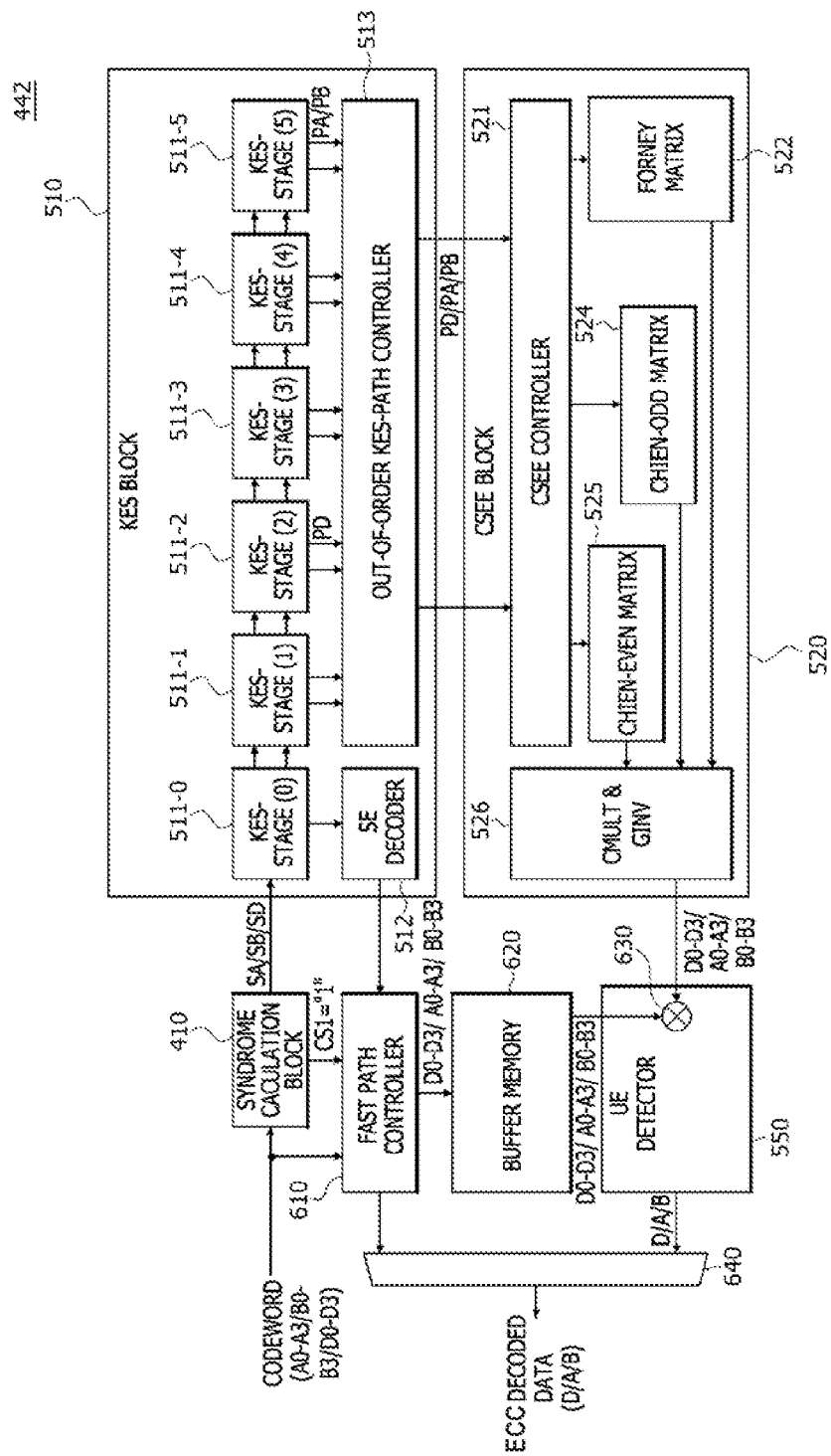
FIG. 10 is a block diagram illustrating a procedure of processing multi-error data in the ECC decoder shown in FIG. 5.
Figure 11:
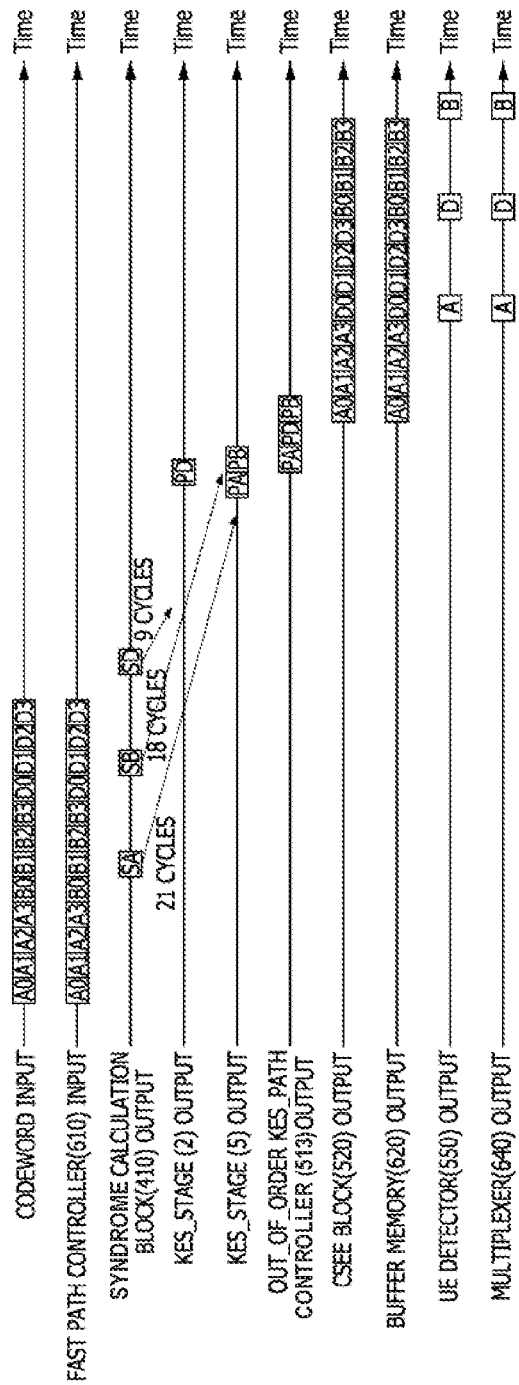
FIG. 11 is a timing diagram illustrating a procedure of processing multi-error data in the ECC decoder shown in FIG. 5.

FIGS. 10 and 11 are a block diagram and a timing diagram illustrating a procedure of processing multi-error data in the ECC decoder 442 shown in FIG. 5, respectively. In FIG. 10, the same reference numerals as used in FIG. 5 denote the same elements. Referring to FIGS. 10 and 11, it may be assumed, for an embodiment, that each of codewords A, B, and D outputted from the memory medium has a data size of 176 bytes. In the present embodiment, it may also be assumed that the codeword A has twenty-one errors, the codeword B has eighteen errors, and the codeword D has nine errors.

If a burst length is set to be four, then the codeword A may include a first codeword A0, a second codeword A1, a third codeword A2, and a fourth codeword A3, each of which has a data size of 44 bytes. In addition, the codeword B may include a first codeword B0, a second codeword B1, a third codeword B2, and a fourth codeword B3, each of which has a data size of 44 bytes. Moreover, the codeword D may include a first codeword D0, a second codeword D1, a third codeword D2, and a fourth codeword D3, each of which has a data size of 44 bytes. In such a case, the first to fourth codewords A0, A1, A2, and A3 may be sequentially inputted to each of the syndrome calculation block 410 and the fast path controller 610. Subsequently, the first to fourth codewords B0, B1, B2, and B3 may be sequentially inputted to each of the syndrome calculation block 410 and the fast path controller 610. Next, the first to fourth codewords D0, D1, D2, and D3 may be sequentially inputted to each of the syndrome calculation block 410 and the fast path controller 610. Although the codewords A, B, and D are sequentially transmitted from the memory medium to the ECC decoder 442, a sequence that ECC decoded data of the codewords A, B, and D are outputted from the ECC decoder 442 may be different from the sequence that the codewords A, B, and D are inputted to the ECC decoder 442 because the non-sequential operation (i.e., an out-of-order operation) is applied to the ECC decoder 442.

Specifically, the syndrome calculation block 410 may calculate syndromes SA, SB, and SD of the codewords A, B, and D to sequentially output the syndromes SA, SB, and SD. As a result of the calculation of the syndromes SA, SB, and SD, the syndrome calculation block 410 may output the first control signal CS1 having a logic "high(1)" level to the fast path controller 610. The syndromes SA, SB, and SD outputted from the syndrome calculation block 410 may be sequentially inputted to the first KES-stage 511-0 of the KES block 510. The first KES-stage 511-0 may sequentially perform matrix operations of the syndromes SA, SB, and SD to generate error location/magnitude polynomials PA, PB, and PD. If at last two errors are detected during the generation of each of the error location/magnitude polynomials PA, PB, and PD, then the first KES-stage 511-0 may sequentially output the error location/magnitude polynomials PA, PB, and PD to the second KES-stage 511-1.

As described with reference to FIG. 5, each of the error location/magnitude polynomials PA, PB, and PD transmitted from the first KES-stage 511-0 to the second KES-stage 511-1 may be separated into the ELP and the EMP. In case of the codeword A, 21 cycles of calculations for the error location/magnitude polynomial PA may be required because the number of errors included in the codeword A is 21. In case of the codeword B, 18 cycles of calculations for the error location/magnitude polynomial PB may be required because the number of errors included in the codeword B is 18. Thus, the error location/magnitude polynomials PA and PB of the codewords A and B may be transmitted from the sixth KES-stage 511-5 to the out-of-order KES-path controller 513. In contrast, in case of the codeword D, 9 cycles of calculations for the error location/magnitude polynomial PD may be required because the number of errors included in the codeword D is 9. Thus, the error location/magnitude polynomial PD of the codeword D may be transmitted from the third KES-stage 511-2 to the out-of-order KES-path controller 513.

As illustrated in FIG. 11, a point in time when the error location/magnitude polynomial PD is outputted from the third KES-stage 511-2 (i.e., the error location/magnitude polynomial PD is inputted to the out-of-order KES-path controller 513) may be located between a point in time when the error location/magnitude polynomial PA is outputted from the sixth KES-stage 511-5 and a point in time when the error location/magnitude polynomial PB is outputted from the sixth KES-stage 511-5. Thus, the error location/magnitude polynomial PA, the error location/magnitude polynomial PD, and the error location/magnitude polynomial PB may be sequentially inputted to the out-of-order KES-path controller 513. That is, although the codewords A, B, and D are sequentially inputted to the ECC decoder 442, the error location/magnitude polynomial PA for the codeword A may be inputted to the out-of-order KES-path controller 513 earliest, and the error location/magnitude polynomial PD for the codeword D and the error location/magnitude polynomial PB for the codeword B may then be sequentially inputted to the out-of-order KES-path controller 513. The out-of-order KES-path controller 513 may output the error location/magnitude polynomials PA, PD, and PB to the CSEE block 520 in the same sequence as the error location/magnitude polynomials PA, PD, and PB are outputted from the second to sixth KES-stages 511-1, . . . , and 511-5.

As described above, the error location/magnitude polynomials may be inputted to the out-of-order KES-path controller 513 in the KES block 510 in order of the error location/magnitude polynomials PA, PD, and PB. Because the out-of-order KES-path controller 513 outputs the error location/magnitude polynomials in the same sequence as the error location/magnitude polynomials are inputted to the out-of-order KES-path controller 513, the out-of-order KES-path controller 513 may sequentially output the error location/magnitude polynomials PA, PD, and PB to the CSEE block 520. The calculating operations of the CSEE block 520 may be performed according to an input sequence of the error location/magnitude polynomials. Thus, ECC decoded data <A0:A3>, ECC decoded data <D0:D3>, and ECC decoded data <B0:B3> may be sequentially outputted from the CSEE block 520.

The ECC decoded data <A0:A3>, the ECC decoded data <D0:D3>, and the ECC decoded data <B0:B3> outputted from the CSEE block 520 may be inputted to the exclusive OR arithmetic element 630 of the UED 550. In addition, the codewords <A0:A3>, the codewords <D0:D3>, and the codewords <B0:B3> stored in the buffer memory 620 may also be inputted to the exclusive OR arithmetic element 630 of the UED 550. As described with reference to FIG. 5, the exclusive OR arithmetic element 630 may perform the exclusive OR operation of the codewords <A0:A3>, <D0:D3>, and <B0:B3> and the ECC decoded data <A0:A3>, <D0:D3>, and <B0:B3> to generate and sequentially output the ECC decoded data A, D and B through the multiplexer 640. As such, the ECC decoder 442 according to an embodiment may perform the ECC decoding operation of the multi-error codewords using an out-of-order KES calculation, thereby reducing a latency in a data read mode.

Figure 12:
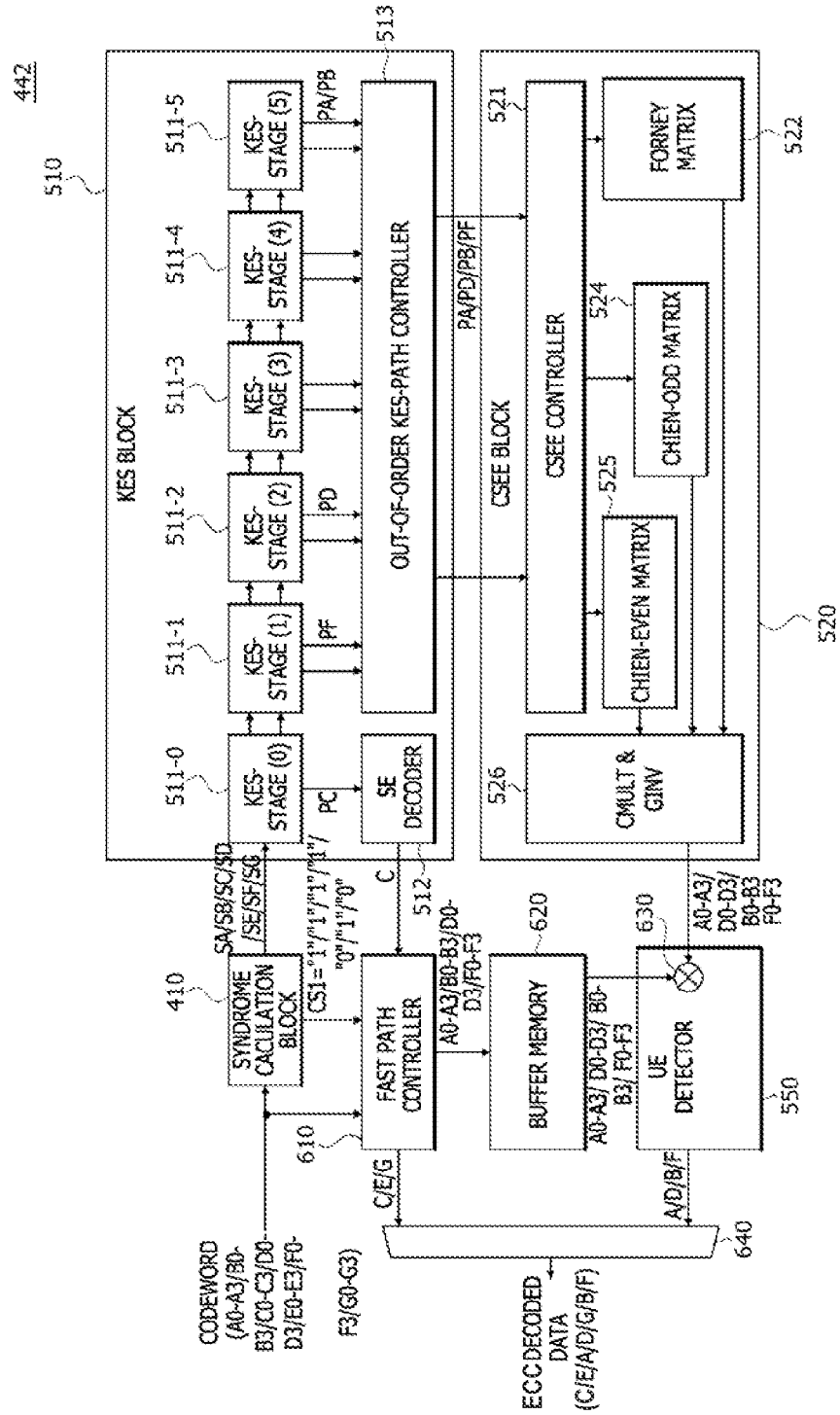
FIG. 12 is a block diagram illustrating a procedure of processing a plurality of data having different number of errors in the ECC decoder shown in FIG. 5.
Figure 13:
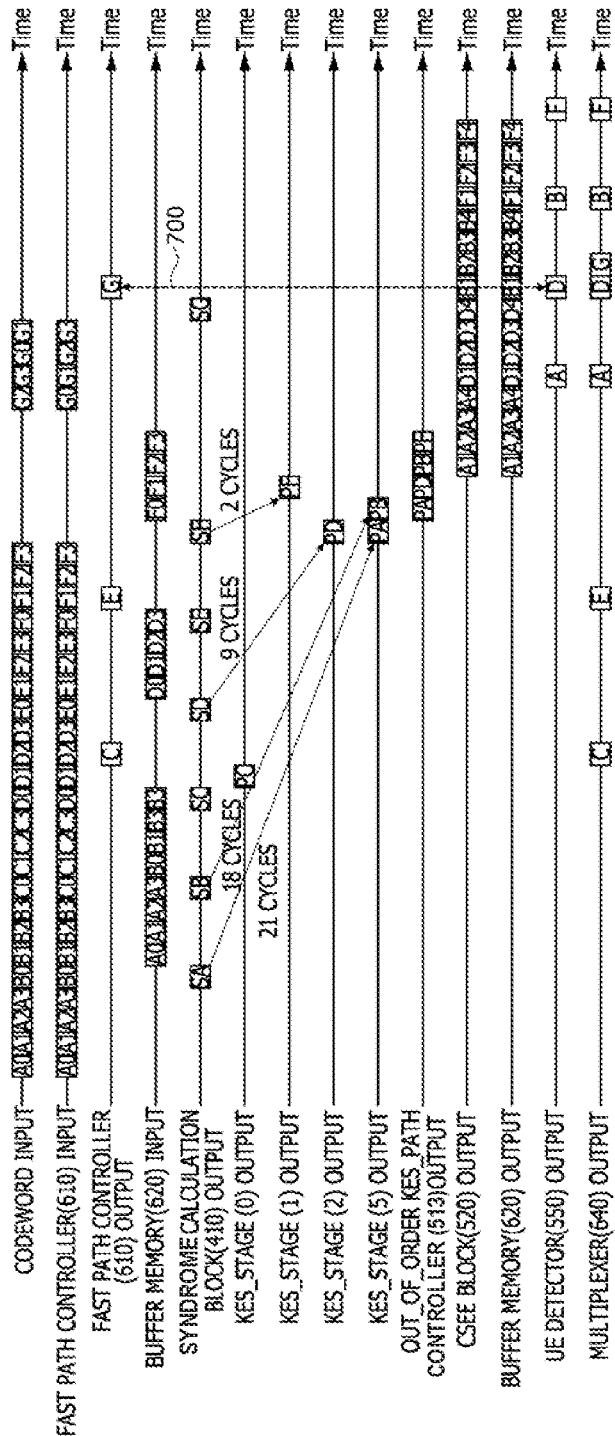
FIG. 13 is a timing diagram illustrating a procedure of processing a plurality of data having different number of errors in the ECC decoder shown in FIG. 5.

FIGS. 12 and 13 are a block diagram and a timing diagram illustrating a procedure of processing a plurality of codewords A, B, C, D, E, F, and G having different number of errors in the ECC decoder 442 shown in FIG. 5, respectively. In FIG. 12, the same reference numerals as used in FIG. 5 denote the same elements. Referring to FIGS. 12 and 13, it may be assumed, for an embodiment, that each of the codewords A, B, C, D, E, F, and G outputted from the memory medium has a data size of 176 bytes. If a burst length is set as four, then the codeword A may include first to fourth codewords A0, A1, A2, and A3, each of which has a data size of 44 bytes. In addition, the codeword B may include first to fourth codewords B0, B1, B2, and B3, each of which has a data size of 44 bytes, the codeword C may include first to fourth codewords C0, C1, C2, and C3, each of which has a data size of 44 bytes, the codeword D may include first to fourth codewords D0, D1, D2, and D3, each of which has a data size of 44 bytes, the codeword E may include first to fourth codewords E0, E1, E2 and E3, each of which has a data size of 44 bytes, the codeword F may include first to fourth codewords F0, F1, F2, and F3, each of which has a data size of 44 bytes, and the codeword G may include first to fourth codewords G0, G1, G2, and G3, each of which has a data size of 44 bytes. In such a case, the codewords A0, A1, A2, A3, B0, B1, B2, B3, C0, C1, C2, C3, D0, D1, D2, D3, E0, E1, E2, E3, F0, F1, F2, F3, G0, G1, G2, and G3 may be sequentially inputted to each of the syndrome calculation block 410 and the fast path controller 610. Although the codewords A, B, C, D, E, F, and G are sequentially transmitted from the memory medium to the ECC decoder 442, a sequence that ECC decoded data of the codewords A, B, C, D, E, F, and G are outputted from the ECC decoder 442 may be different from the sequence that the codewords A, B, C, D, E, F, and G are inputted to the ECC decoder 442 because the non-sequential operation (i.e., an out-of-order operation) is applied to the ECC decoder 442.

Specifically, the syndrome calculation block 410 may calculate syndromes SA, SB, SC, SD, SE, SF, and SG of the codewords A, B, C, D, E, F, and G to sequentially output the syndromes SA, SB, SC, SD, SE, SF, and SG. In the present embodiment, it may also be assumed that the codewords A, B, D, and F have twenty-one errors, eighteen errors, nine errors, and two errors, the codeword C has a single error, and the codewords E and G have no errors. Because the syndrome calculations are performed in the same sequence as the codewords are inputted to the syndrome calculation block 410, the syndromes SA, SB, SC, SD, SE, SF, and SG may be sequentially outputted from the syndrome calculation block 410. In addition, the syndrome calculation block 410 may also sequentially output the first control signals CS1 having a logic "high(1)" level, a logic "high(1)" level, a logic "high(1)" level, a logic "high(1)" level, a logic "low(0)" level, a logic "high(1)" level, and a logic "low(0)" level to the fast path controller 610. As described with reference to FIG. 5, no error exists in the codeword when the first control signals CS1 has a logic "low(0)" level, and at least one error exists in the codeword when the first control signals CS1 has a logic "high(1)" level.

The syndromes SA, SB, SC, SD, SE, SF, and SG outputted from the syndrome calculation block 410 may be sequentially inputted to the first KES-stage 511-0 of the KES block 510. Although the syndromes SE and SG of the codewords E and G having no error are inputted to the first KES-stage 511-0, the first KES-stage 511-0 might not calculate and generate any error location/magnitude polynomials for the syndromes SE and SG. That is, the first KES-stage 511-0 may calculate and generate only the error location/magnitude polynomials for the syndromes SA, SB, SC, SD, and SF. An error location/magnitude polynomial PC for the syndrome SC having a single error may be inputted to the single error decoder 512. Error location/magnitude polynomials PA, PB, PD and PF for the syndromes SA, SB, SD, and SF having at least two errors may be sequentially inputted to the second KES-stage 511-1.

While the above calculating operations are performed in the KES block 510, the fast path controller 610 may output the codewords E and G (having no error) stored into the fast path controller 610 in response to the first control signals CS1 having a logic "low(0)" level. The codewords E and G outputted from the fast path controller 610 may be inputted to the first input terminal of the multiplexer 640. In addition, the single error decoder 512 receiving the error location/magnitude polynomial PC for the syndrome SC having a single error may find a solution of the error location/magnitude polynomial PC to correct the single error. Corrected ECC decoded data C may be inputted to the fast path controller 610. The fast path controller 610 may output the corrected ECC decoded data C to the first input terminal of the multiplexer 640.

As described above, the ECC decoded data of the codewords C, E, and G having no error or a single error may be inputted to the first input terminal of the multiplexer 640 through the fast path controller 610. In such a case, the ECC decoded data may be inputted to the fast path controller 610 in order of the ECC decoded data C, E, an G. Specifically, in case of the codewords E and G having no error, no calculation of the error location/magnitude polynomial is performed in the KES block 510, and the codewords E and G may be inputted to the multiplexer 640 only through the fast path controller 610. However, as illustrated in FIG. 13, a point in time when the error location/magnitude polynomial PC is outputted from the first KES-stage 511-0 may precede a point in time when the syndromes SE and SG are calculated. This means that the ECC decoded data C for the codeword C having a single error are inputted to the fast path controller 610 before the codewords E and G having no error are inputted to the fast path controller 610. Thus, the ECC decoded data C of the codeword C may be outputted from the fast path controller 610 earliest, and the ECC decoded data E and G may then be sequentially outputted from the fast path controller 610.

Meanwhile, the calculating operations for the error location/magnitude polynomials PA, PB, PD, and PF of the syndromes SA, SB, SD, and SF having at least two errors may be sequentially performed in the second to sixth KES-stages 511-1, . . . , and 511-5. Specifically, the error location/magnitude polynomials PA, PB, PD, and PF generated by the first KES-stage 511-0 may be inputted to the second KES-stage 511-1. As described with reference to FIG. 5, each of the error location/magnitude polynomials PA, PB, PD, and PF transmitted from the first KES-stage 511-0 to the second KES-stage 511-1 may be separated into the ELP and the EMP. The second KES-stage 511-1 may sequentially perform the calculating operations of the error location/magnitude polynomials PA, PB, PD, and PF to identify the error locations and the error magnitudes.

Because the codeword A of the error location/magnitude polynomial PA calculated a first time in the second KES-stage 511-1 has twenty-one errors, the error location/magnitude polynomial PA calculated in the second KES-stage 511-1 may be inputted to the third KES-stage 511-2. Subsequently, because the codeword B of the error location/magnitude polynomial PB calculated a second time in the second KES-stage 511-1 has eighteen errors, the error location/magnitude polynomial PB calculated in the second KES-stage 511-1 may also be inputted to the third KES-stage 511-2. Next, because the codeword D of the error location/magnitude polynomial PD calculated a third time in the second KES-stage 511-1 has nine errors, the error location/magnitude polynomial PD calculated in the second KES-stage 511-1 may also be inputted to the third KES-stage 511-2. However, the codeword F of the error location/magnitude polynomial PF calculated lastly in the second KES-stage 511-1 has two errors. Thus, the error location/magnitude polynomial PF having the identified error location and the identified error magnitude may be obtained by the calculation of the second KES-stage 511-1, and the error location/magnitude polynomial PF is not inputted to the third KES-stage 511-2 but directly inputted to the out-of-order KES-path controller 513.

The third KES-stage 511-2 may sequentially perform the calculating operations of the error location/magnitude polynomials PA, PB and PD to identify the error locations and the error magnitudes. Because the codeword A of the error location/magnitude polynomial PA calculated a first time in the third KES-stage 511-2 has twenty-one errors, the error location/magnitude polynomial PA calculated in the third KES-stage 511-2 may be inputted to the fourth KES-stage 511-3. Subsequently, because the codeword B of the error location/magnitude polynomial PB calculated a second time in the third KES-stage 511-2 has eighteen errors, the error location/magnitude polynomial PB calculated in the third KES-stage 511-2 may also be inputted to the fourth KES-stage 511-3. However, the codeword D of the error location/magnitude polynomial PD calculated lastly in the third KES-stage 511-2 has nine errors. Thus, the error location/magnitude polynomial PD having the identified error location and the identified error magnitude may be obtained by the calculation of the third KES-stage 511-2, and the error location/magnitude polynomial PD is not inputted to the fourth KES-stage 511-3 but directly inputted to the out-of-order KES-path controller 513.

The fourth KES-stage 511-3 may sequentially perform the calculating operations of the error location/magnitude polynomials PA and PB to identify the error locations and the error magnitudes. Because the codeword A of the error location/magnitude polynomial PA has twenty-one errors and the codeword B of the error location/magnitude polynomial PB has eighteen errors, the error location/magnitude polynomials PA and PB calculated in the fourth KES-stage 511-3 may be sequentially inputted to the fifth KES-stage 511-4. Because the error location and the error magnitude are not identified even by the calculating operations in the fifth KES-stage 511-4, the error location/magnitude polynomials PA and PB calculated in the fifth KES-stage 511-4 may be sequentially inputted to the sixth KES-stage 511-5. Subsequently, the sixth KES-stage 511-5 may output the error location/magnitude polynomials PA and PB to the out-of-order KES-path controller 513.

As described above, although the codewords A, B, D, and F having at least two errors are sequentially inputted to the ECC decoder 442, the error location/magnitude polynomials may be inputted to the out-of-order KES-path controller 513 in order of the error location/magnitude polynomial PA generated by 21 cycles of calculating operations, the error location/magnitude polynomial PD generated by 9 cycles of calculating operations, the error location/magnitude polynomial PB generated by 18 cycles of calculating operations, and the error location/magnitude polynomial PF generated by 2 cycles of calculating operations. Specifically, as illustrated in FIG. 13, the error location/magnitude polynomial PF having two errors may be outputted from the KES-stage (i.e., the second KES-stage 511-1) disposed at a previous stage of the KES-stages outputting the other error location/magnitude polynomials PA, PB, and PD and may be inputted to the out-of-order KES-path controller 513. However, a point in time when the syndrome SF is outputted from the syndrome calculation block 410 may be later than points in time when the error location/magnitude polynomials PA, PD, and PB are inputted to the out-of-order KES-path controller 513. Thus, the error location/magnitude polynomial PF may be inputted to the out-of-order KES-path controller 513 later than the error location/magnitude polynomials PA, PD, and PB.

In addition, the error location/magnitude polynomial PD having nine errors may be transmitted from the third KES-stage 511-2 to the out-of-order KES-path controller 513. The point in time when the error location/magnitude polynomial PD is outputted from the third KES-stage 511-2 may be located between a point in time when the error location/magnitude polynomial PA is outputted from the sixth KES-stage 511-5 and a point in time when the error location/magnitude polynomial PB is outputted from the sixth KES-stage 511-5. Thus, the error location/magnitude polynomials may be inputted to the out-of-order KES-path controller 513 in order of the error location/magnitude polynomial PA, the error location/magnitude polynomial PD, and the error location/magnitude polynomial PB. As a result, the out-of-order KES-path controller 513 may output the error location/magnitude polynomials PA, PD, and PB to the CSEE block 520 in the same sequence as the error location/magnitude polynomials PA, PD, and PB are outputted from the second to sixth KES-stages 511-1, . . . , and 511-5.

The calculating operations of the CSEE block 520 may be performed according to an input sequence of the error location/magnitude polynomials PA, PD, PB, and PF. Thus, ECC decoded data <A0:A3>, ECC decoded data <D0:D3>, ECC decoded data <B0:B3>, and ECC decoded data <F0:F3> may be sequentially outputted from the CSEE block 520. The ECC decoded data <A0:A3>, <D0:D3>, <B0:B3>, and <F0:F3> outputted from the CSEE block 520 may be inputted to the exclusive OR arithmetic element 630 of the UED 550. In addition, the codewords <A0:A3>, the codewords <D0:D3>, the codewords <B0:B3>, and the codewords <F0:F3> stored in the buffer memory 620 may also be inputted to the exclusive OR arithmetic element 630 of the UED 550. As described with reference to FIG. 5, the exclusive OR arithmetic element 630 may perform the exclusive OR operation of the codewords <A0:A3>, <D0:D3>, <B0:B3>, and <F0:F3> and the ECC decoded data <A0:A3>, <D0:D3>, <B0:B3>, and <F0:F3> bit-by-bit to generate and sequentially output the ECC decoded data A, D, B, and F through the multiplexer 640.

As illustrated in FIG. 13, the ECC decoded data may be inputted to the multiplexer 640 in order of the ECC decoded data C, E, A, D/G, B, and F. As indicated by the reference numeral 700 in FIG. 13, the ECC decoded data G transmitted through the fast path controller 610 and the ECC decoded data D transmitted through the UED 550 may be simultaneously inputted to the first input terminal and the second input terminal of the multiplexer 640, respectively. In such a case, a priority may be given to the ECC decoded data G inputted to the first input terminal or the ECC decoded data D inputted to the second input terminal. In an embodiment, the priority may be given to the ECC decoded data D inputted to the second input terminal rather than the ECC decoded data G inputted to the first input terminal. Accordingly, the ECC decoded data G may be outputted from the multiplexer 640 earlier than the ECC decoded data D.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An error correction code (ECC) decoder comprising:
a syndrome calculation block configured to receive a codeword from a memory medium to calculate and output a syndrome;
a fast path controller configured to receive and store the codeword and configured to output the codeword when no error is detected from a result of the calculation of the syndrome;
a key equation solver (KES) block configured to include a plurality of KES-stages, wherein a first KES-stage of the plurality of KES-stages is configured to calculate and output an error location/magnitude polynomial of the syndrome outputted from the syndrome calculation block, each of a second to last KES-stages of the plurality of KES-stages is configured to receive the error location/magnitude polynomial from the previous KES-stage to output an error location/magnitude polynomial generated by an additional calculating operation, and the additionally calculated error location/magnitude polynomial is not transmitted to the next KES-stage but directly outputted when an error location and an error magnitude are identified by the additionally calculated error location/magnitude polynomial;

a Chien-search and errata-evaluator (CSEE) block configured to find a solution of the additionally calculated error location/magnitude polynomial to correct an error of the codeword;

an uncorrectable error detector (UED) configured to perform a logical operation of output data of the CSEE block and the codeword stored in the fast path controller to discriminate whether the codeword is corrected and to output data; and a multiplexer configured to output data having an earlier input point in time out of data corresponding to the codeword outputted from the fast path controller and the data outputted from the UED as final ECC decoded data, wherein the KES block further includes an out-of-order KES-path controller configured to receive the error location/magnitude polynomials outputted by the second to last KES-stages and configured to output the error location/magnitude polynomials in the same sequence as the error location/magnitude polynomials are inputted to the out-of-order KES-path controller.

2. The ECC decoder of claim 1, further comprising a buffer memory configured to receive and store the codeword stored in the fast path controller and configured to output the codeword for the logical operation performed by the UED.

3. The ECC decoder of claim 1,
wherein the KES block further includes a single error decoder configured to correct a single error of the codeword to output ECC decoded data to the fast path controller when the single error is detected as an only error from a result of the calculation of the error location/magnitude polynomial in the first KES-stage.

4. The ECC decoder of claim 3,
wherein the fast path controller is configured to output the ECC decoded data outputted from the single error decoder to the multiplexer.

5. The ECC decoder of claim 1,
wherein the syndrome calculation block is configured to output a control signal having a first level to the fast path controller when no error is detected from a result of the calculation of the syndrome; and
wherein the syndrome calculation block is configured to output the control signal having a second level to the fast path controller when an error is detected from a result of the calculation of the syndrome.

6. The ECC decoder of claim 5,
wherein the fast path controller is configured to output the codeword stored in the fast path controller to the multiplexer in response to the control signal having the first level; and
wherein the fast path controller is configured to output ECC decoded data outputted from KES block to the multiplexer in response to the control signal having the second level.

7. The ECC decoder of claim 1,
wherein the first KES-stage of the KES block is configured to transmit the error location/magnitude polynomial to a single error decoder when a single error is an only error detected from a result of the calculation of the syndrome; and
wherein the first KES-stage of the KES block is configured to transmit the error location/magnitude polynomial to a next KES-stage when at least two errors are detected from a result of the calculation of the syndrome.

8. The ECC decoder of claim 1,
wherein the error location/magnitude polynomial outputted from each of the plurality of KES-stages in the KES block is separated into an error-locator polynomial (ELP) and an error-magnitude polynomial (EMP); and
wherein the calculation of the error location/magnitude polynomial includes calculating the ELP and calculating the EMP.

* * * * *